United States Patent
Aziz et al.

(10) Patent No.: US 7,411,531 B2
(45) Date of Patent: Aug. 12, 2008

(54) METHODS AND APPARATUS FOR ASYNCHRONOUS SAMPLING OF A RECEIVED SIGNAL AT A DOWNSAMPLED RATE

(75) Inventors: Pervez M. Aziz, Dallas, TX (US); Mohammad S. Mobin, Orefield, PA (US)

(73) Assignee: Agere Systems Inc., Allentown, PA (US)

( * ) Notice: Subject to any disclaimer, the term of this patent is extended or adjusted under 35 U.S.C. 154(b) by 92 days.

(21) Appl. No.: 11/480,327

(22) Filed: Jun. 30, 2006

(65) Prior Publication Data

US 2008/0001797 A1  Jan. 3, 2008

(51) Int. Cl.
*H03M 1/06* (2006.01)
(52) U.S. Cl. .................. 341/118; 341/61; 708/290; 708/313; 375/355; 375/376
(58) Field of Classification Search .................. 341/61; 708/290, 313
See application file for complete search history.

(56) References Cited

U.S. PATENT DOCUMENTS

| | | | | |
|---|---|---|---|---|
| 5,504,785 | A * | 4/1996 | Becker et al. ................ | 375/344 |
| 5,982,832 | A * | 11/1999 | Ko .............................. | 375/371 |
| 6,128,357 | A * | 10/2000 | Lu et al. ..................... | 375/355 |
| 6,583,822 | B1 * | 6/2003 | Jun ............................. | 348/537 |
| 6,590,948 | B1 * | 7/2003 | Genrich ...................... | 375/355 |
| 6,996,193 | B2 * | 2/2006 | Yamagata et al. ........... | 375/329 |
| 7,170,957 | B2 * | 1/2007 | Moy et al. ................... | 375/346 |
| 7,184,498 | B2 * | 2/2007 | Moy et al. ................... | 375/346 |
| 7,187,739 | B2 * | 3/2007 | Ma ............................. | 375/355 |
| 7,245,450 | B1 * | 7/2007 | Cherubini et al. ........ | 360/73.12 |
| 7,245,658 | B2 * | 7/2007 | Wang et al. ................. | 375/229 |
| 7,245,687 | B2 * | 7/2007 | Chang ........................ | 375/376 |
| 2003/0099052 | A1 | 5/2003 | Annampedu et al. .......... | 360/39 |
| 2005/0094754 | A1 * | 5/2005 | Serizawa ..................... | 375/350 |
| 2005/0117489 | A1 * | 6/2005 | Serizawa ................. | 369/59.21 |
| 2005/0120066 | A1 * | 6/2005 | Serizawa ..................... | 708/290 |
| 2005/0232383 | A1 * | 10/2005 | Sommer ..................... | 375/350 |
| 2006/0115034 | A1 * | 6/2006 | Chen ........................... | 375/355 |
| 2006/0210002 | A1 * | 9/2006 | Yang et al. .................. | 375/350 |

\* cited by examiner

*Primary Examiner*—Khai M Nguyen
(74) *Attorney, Agent, or Firm*—Ryan, Mason & Lewis, LLP

(57) ABSTRACT

Methods and apparatus are provided for decimated interpolated clock/data recovery (ICDR) to perform asynchronous sampling of a received signal. A received signal is converted to a plurality of digital samples at a downsampled rate that is lower than a rate of the received signal. The plurality of digital samples are interpolated using a plurality of parallel interpolation filters operating at the downsampled rate. An output of each parallel interpolation filter is applied to a corresponding data detector operating at the downsampled rate to generate digital data. An estimate of a timing error is generated based on the digital data. The timing error values are processed to generate an interpolation phase value that is applied to the parallel interpolation filters. A recovered clock is optionally generated, having edges corresponding to a desired synchronous sampling period.

20 Claims, 8 Drawing Sheets

METHODS AND APPARATUS FOR ASYNCHRONOUS SAMPLING OF A RECEIVED SIGNAL AT A DOWNSAMPLED RATE

FIELD OF THE INVENTION

The present invention relates generally to techniques for clock and data recovery, and more particularly, to techniques for interpolated clock/data recovery.

BACKGROUND OF THE INVENTION

Digital communication receivers typically sample an incoming waveform and then detect the sampled data. Typically, a receiver includes a Clock and Data Recovery (CDR) system to recover the clock and data from an incoming data stream. The CDR system generates a clock signal having the same frequency and phase as the incoming signal, which is then used to sample the received signal and detect the transmitted data.

U.S. patent application Ser. No. 10/965,138, filed Oct. 14, 2004, entitled "Parallel Sampled Multi Stage Decimated Digital Loop Filter for Clock/Data Recovery," incorporated by reference herein, discloses a CDR architecture that uses an oversampled phase detector followed by a parallel sampled multi-stage decimated digital loop filter. The use of parallel sampled multi-stage decimated loop filtering significantly reduces the area and power required by previous analog loop filter based solutions. In addition, the circuit behavior of the digital loop filter can be verified against the architectural level behavior and the digital loop filter parameters are not subject to analog errors and process/voltage/temperature (PVT) variations. However, an implementation of the architecture makes use of an analog phase selection circuit (PSC) that is implemented as a voltage controlled delay line (VCDL). VCDL errors, however, can degrade good jitter tolerance performance.

It is therefore desirable to further reduce the proportion of analog circuitry determining the performance of the CDR loop. Digital interpolation has been used to perform an all digital timing recovery that eliminates most analog errors and PVT variations. See, for example, F. Gardner, "Interpolation in Digital Modems—Part I: Fundamentals," IEEE Trans. on Communications, 501-507 (March, 1993); L. Erup et al., "Interpolation in Digital Modems—Part II: Implementation and Performance," IEEE Trans. on Communications, 998-1007 (June, 1993); M. Spurbeck and R. Behrens, "Interpolated Timing Recovery for Hard Disk Drive Read Channels," Proc. IEEE Int'l Conf. on Communications (ICC), 1618-1624 (1997); or Z. Wu and J. Cioff, "A MMSE Interpolated Timing Recovery Scheme for the Magnetic Recording Channel," IEEE Int'l Conf. on Communications (ICC) (1997). In such interpolated timing recovery (ITR) or interpolated clock/data recovery (ICDR) approaches, the interpolation filters and CDR loop filter process data at the full baud rate.

A need exists for methods and apparatus for digital ICDR that perform the timing recovery computations at less than the baud rate.

SUMMARY OF THE INVENTION

Generally, methods and apparatus are provided for decimated interpolated clock/data recovery (ICDR). According to one aspect of the invention, methods and apparatus are disclosed for asynchronous sampling of a received signal. A received signal is converted to a plurality of digital samples at a downsampled rate that is lower than a rate of the received signal. The plurality of digital samples are interpolated using a plurality of parallel interpolation filters operating at the downsampled rate. An output of each parallel interpolation filter is applied to a corresponding data detector operating at the downsampled rate to generate digital data. An estimate of a timing error is generated based on the digital data. The timing error values are processed to generate an interpolation phase value that is applied to the parallel interpolation filters. According to another aspect of the invention, a recovered clock is generated, having edges corresponding to a desired synchronous sampling period.

The digital samples at the downsampled rate can be generated, for example, by delaying a full rate output of an analog to digital converter or by a plurality of parallel analog to digital converters. The timing error estimates can be generated, for example, by generating an estimate of the timing error for each parallel data detector at the downsampled rate, and combining the plurality of downsampled timing error values to generate full rate timing error values. If one or more oversampled phase detectors are used to generate the timing error estimate, then the plurality of digital samples can be further interpolated to phase shift the digital samples by a fractional amount.

A more complete understanding of the present invention, as well as further features and advantages of the present invention, will be obtained by reference to the following detailed description and drawings.

DETAILED DESCRIPTION

The present invention provides methods and apparatus for digital ICDR that perform the timing recovery computations at less than the baud rate. An architecture is disclosed for performing digital decimated ICDR. Several variations to the architecture are disclosed involving various power, area and/or speed tradeoffs, including the use of the architecture for a DFE equalized signal.

Traditional Full Rate ICDR

Figure 1:
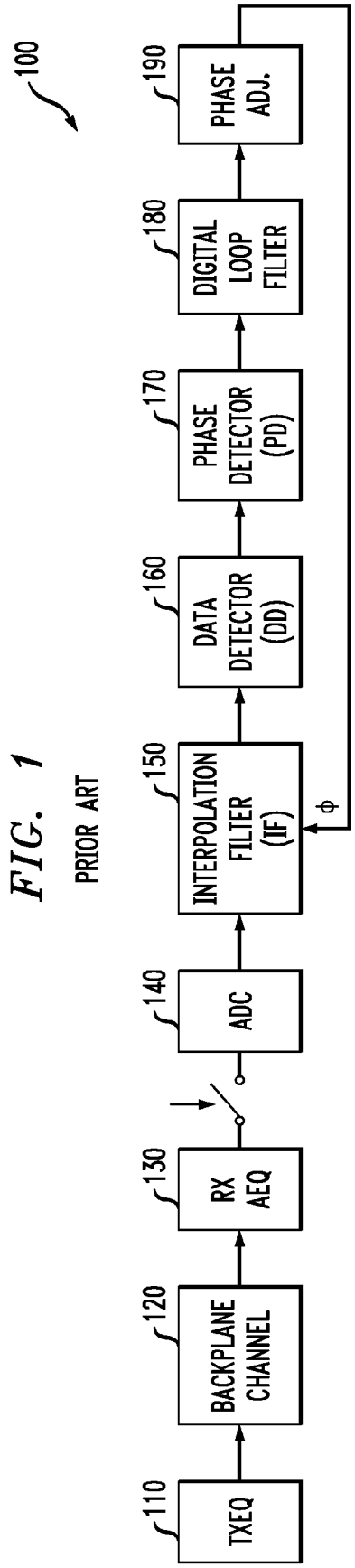
FIG. 1 illustrates a block diagram of a traditional full rate ICDR system.

FIG. 1 illustrates a block diagram of a traditional full rate ICDR system 100. As shown in FIG. 1, the equalization for the exemplary ICDR system 100 is a combination of transmitter (TX) equalization 110 and receiver (RX) analog equalization (AEQ) 130 following the channel 120, such as a backplane or read channel. The output of the RX AEQ 130 is uniformly spaced asynchronous samples sampled at a fixed sampling rate and quantized with the use of an analog to digital converter (ADC) 140. The samples of the ADC 140 are interpolated by an interpolation filter 150 to the desired phases before being detected by a data detector (DD) 160 (such as a digital slicer or a sequence detector).

The DD 160 produces the signals required to drive a phase detector (PD) 170 that converts amplitude error into timing error. The output of the PD 170 is filtered with a digital loop filter 180 whose output is processed using a phase adjustment block 190 that computes the appropriate fractional phase $\phi$ corresponding with the interpolation filter (IF) 150 to be chosen that produces a fractional delay of $\phi$. Generally, the interpolation filter 150 has a magnitude response similar to an all-pass filter and delays the signal by a desired amount, based on the fractional delay $\phi$.

The IF 150, PD 170, and the loop filter 180 of FIG. 1 all run at the baud rate. According to one aspect of the present invention, one or more blocks of the ICDR 100 are decimated to run at a lower rate.

Interpolation Filter Implementation

Figure 2:
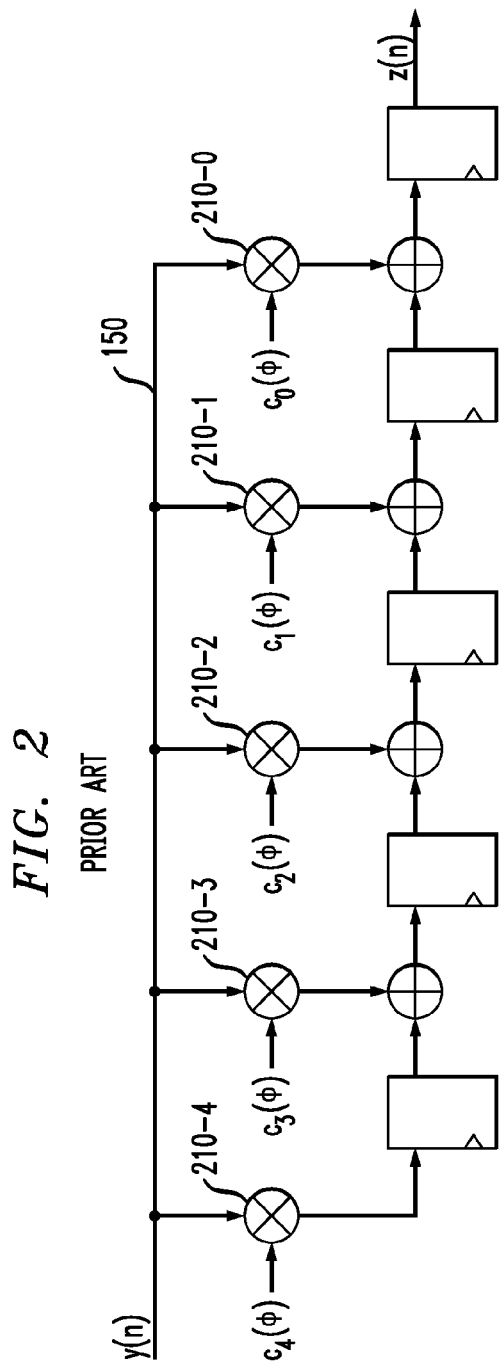
FIG. 2 illustrates an exemplary implementation of the interpolation filter of FIG. 1 in a transposed direct form for a five tap Finite Impulse Response (FIR) filter.

FIG. 2 illustrates an exemplary implementation of the interpolation filter 150 of FIG. 1 in a transposed direct form for a five tap Finite Impulse Response (FIR) filter. As shown in FIG. 2, the coefficients, $c_0$ through $c_4$, for the filter taps vary as a function of the fractional delay, $\phi$. In the exemplary implementation shown in FIG. 2, the multiply operations are shown to occur instantly; however, pipeline latency could optionally be added after each multiplier 210-0 through 210-4 without affecting the functionality of the interpolation filter 150. In order to achieve high resolution interpolation phase quantization, between 16 and 32 interpolation filters are generally required, corresponding to phase quantization between T/16 and T/32. The entire set of, e.g., 16 or 32 filters can be implemented in parallel and switch between the filters as the fractional delay, $\phi$, is updated by the CDR loop filter 180.

The number of multipliers 210 can be reduced by loading in the coefficients from a memory (not shown) on a rotating basis. However, the input state information would need to be retained for each phase to provide a seamless transition from phase to phase.

Frequency Offset

To handle frequency offset, some amount of oversampling in the range of up to 5% is typically used. See, for example, M. Spurbeck and R. Behrens, "Interpolated Timing Recovery for Hard Disk Drive Read Channels," Proc. IEEE Int'l Conf. on Communications (ICC), 1618-1624 (1997); or Z. Wu and J. Cioff, "A MMSE Interpolated Timing Recovery Scheme for the Magnetic Recording Channel," IEEE Int'l Conf. on Communications (ICC) (1997). In this manner, the average rate of samples can be brought to the baud rate by fractionally downsampling by, for example, one out of every 20 samples for 5% oversampling, after the correct phases are interpolated. The actual oversampling rate cannot be assumed to be 5%, because the frequency offset is not known a priori.

Decimated ICDR

The present invention performs decimated ICDR whereby both the interpolation filters and CDR loop filter can operate at a lower rate than the baud rate. In one exemplary implementation of the invention, discussed further below, groups of full rate samples from the ADC are downsampled and commutated to various interpolation filters each of which operate at the downsampled rate. The outputs of each interpolation filter are optionally sliced to produce binary data. The binary data drives a phase detector that produces an estimate of the timing error. At this point, there is still a set of PD outputs, each at a downsampled rate. These downsampled PD outputs are combined through a decimation filter to produce an overall output at the downsampled rate. The overall decimated PD output is then input to the digital CDR loop filter. The loop filter output controls a phase processing block which converts the loop filter output into a final selected interpolation phase which is continually updated.

Full Rate Front End: One ADC Embodiment

Figure 3:
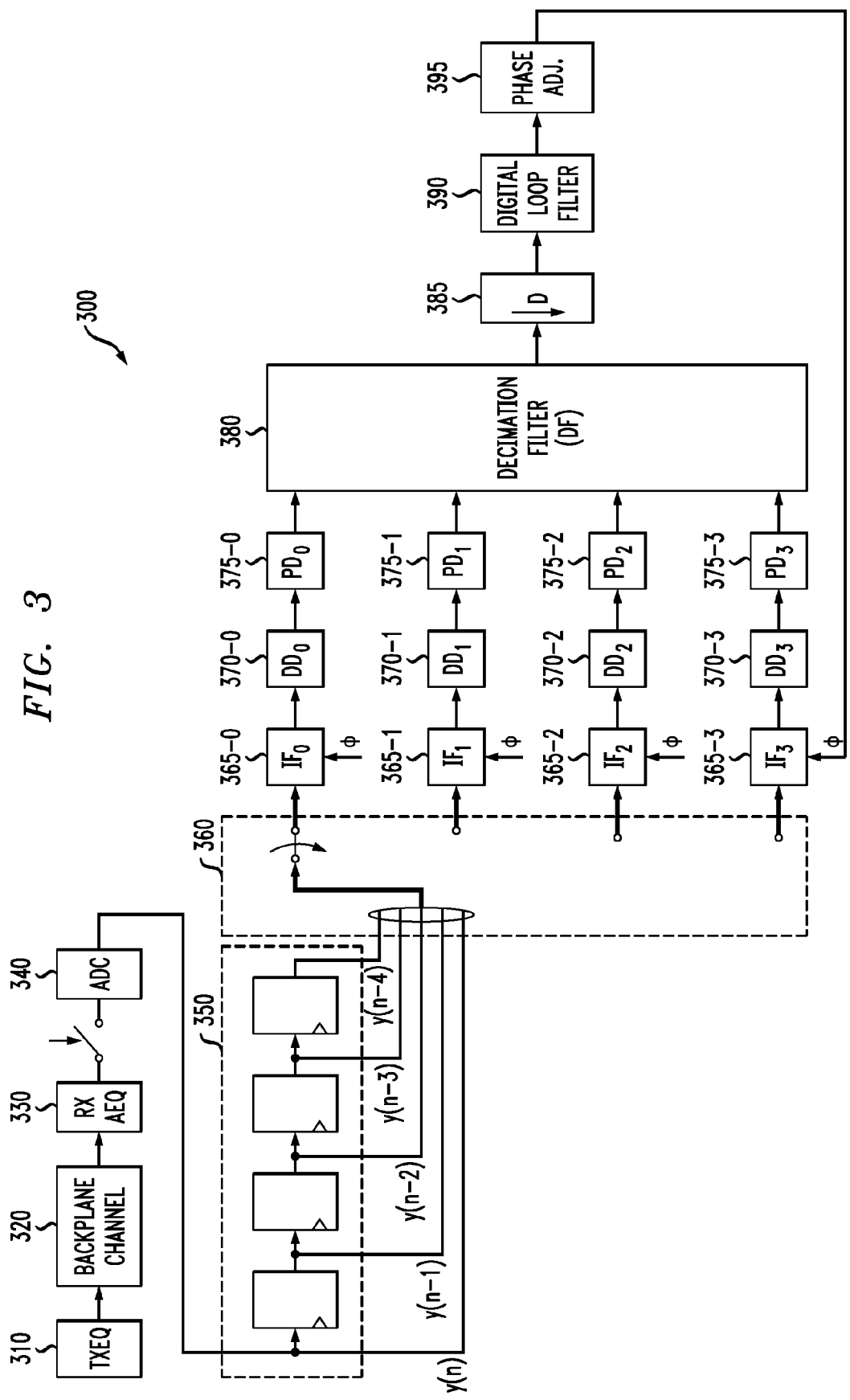
FIG. 3 is a block diagram of an exemplary decimated ICDR incorporating features of the present invention.

FIG. 3 is a block diagram of an exemplary decimated ICDR 300 incorporating features of the present invention. The transmitter (TX) equalization 310, channel 320, receiver (RX) analog equalization (AEQ) 330 and analog to digital converter (ADC) 340 operate in a similar manner to FIG. 1. The full rate samples from the ADC 340 are delayed by an exemplary delay stage 350 having four delay elements (for an exemplary 4x decimated or downsampled CDR, assuming a five tap FIR interpolation filter). Each delay element is offset from the next by 1T. The original samples and four delayed versions of the samples are then applied to a commutator ring 360 implemented with a switch matrix. The commutator ring/switch 360 distributes the lower rate samples to parallel interpolation filters 365-0 through 365-3 operating at the lower downsampled rate and discussed further below in conjunction with FIG. 4.

In the exemplary embodiment shown in FIG. 3, where there are four (N=4) delay elements in delay stage 360, the lower downsampled rate is 1/N baud rate. The first interpolation filter 365-0, for example, at time $t_1$, receives 5 samples (where the number of samples corresponds to the number of FIR filter taps). At time $t_2$, the second interpolation filter 365-1 receives the next 5 samples and so on.

The outputs of each interpolation filter 365 are optionally sliced by a corresponding data detector 370-0 through 370-3 to produce binary data. The binary data drives phase detectors 375-0 through 375-3 that produce an estimate of the timing error. Each phase detector 375-0 through 375-3 generates a timing error value at the downsampled rate. These downsampled PD outputs are combined through a decimation filter 380 to produce an output at full rate, and then downsampled at stage 385 to keep one of the four values at the downsampled rate. The overall decimated PD output is then input to the digital CDR loop filter 390. The output of the loop filter 390 controls a phase adjustment processing block 395 that converts the output of the loop filter 390 into a final selected interpolation phase that is continually updated and applied to each interpolation filter 365, as shown in FIG. 3.

In the embodiment of FIG. 3, there is a single ADC 345 running at the full rate and all the necessary input samples for the interpolation filters 365 are obtained by delaying the ADC output at delay stage 350. It is again noted that groups of five ADC delayed samples are collected for exemplary five tap interpolation filters.

Figure 4:
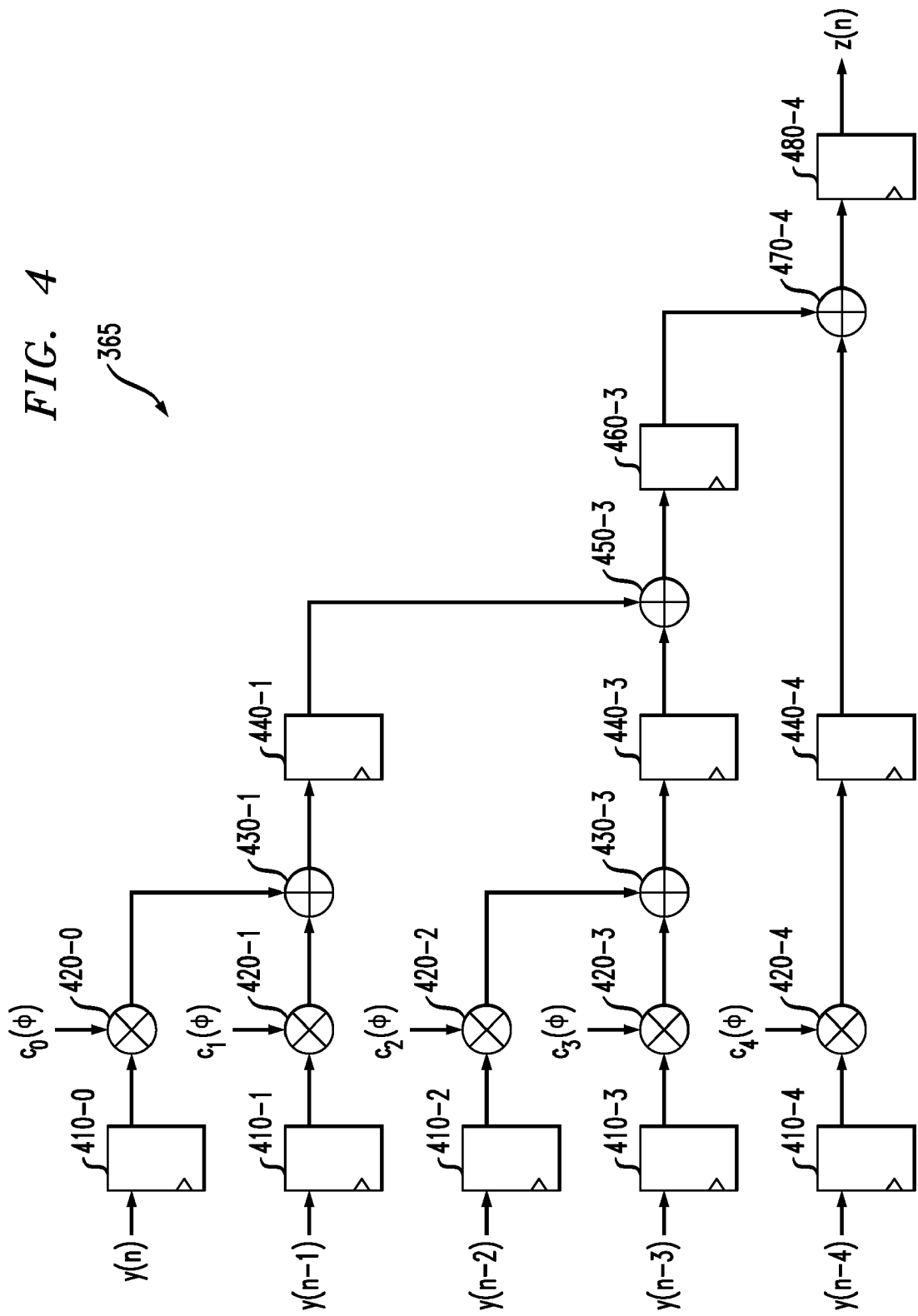
FIG. 4 illustrates an exemplary pipelined implementation of an interpolation filter of FIG. 3.

FIG. 4 illustrates an exemplary pipelined implementation of an interpolation filter 365 of FIG. 3. For the decimated ICDR of the present invention, since the input samples come to each interpolation filter 365 in parallel, the transposed direct form implementation of FIG. 2 cannot be used. The set of input samples change every 4T. Thus, the circuitry in this filter 365 can be clocked at $\frac{1}{4}^{th}$ the baud rate.

The exemplary interpolation filter 365 shown in FIG. 4 is a direct form pipelined filter for an exemplary five tap FIR implementation. As shown in FIG. 4, the delayed versions, y, of the samples from the delay stage 350 are further delayed by corresponding delay stages 410-0 through 410-4 and the delayed version is applied to a multiplier 420-0 through 420-4 that multiplies the delayed version by a corresponding filter tap coefficient $c_0$ through $c_4$. An adder 430-1 combines the first two adjacent states and a second adder 430-3 combines the next two adjacent states. The three remaining values are then delayed by delay stages 440-1, 440-3 and 440-4, as shown in FIG. 4. An adder 450-3 combines the first two adjacent of the remaining states, which is then delayed at stage 460-3. An adder 470-4 combines the two remaining states, which is then delayed to produce the final output, z(n).

It is noted that the latency of the interpolation filter 365 of FIG. 4 is absorbed in the timing loop latency.

Parallel Sampled Front End: Multiple ADCs Embodiment

Figure 5:
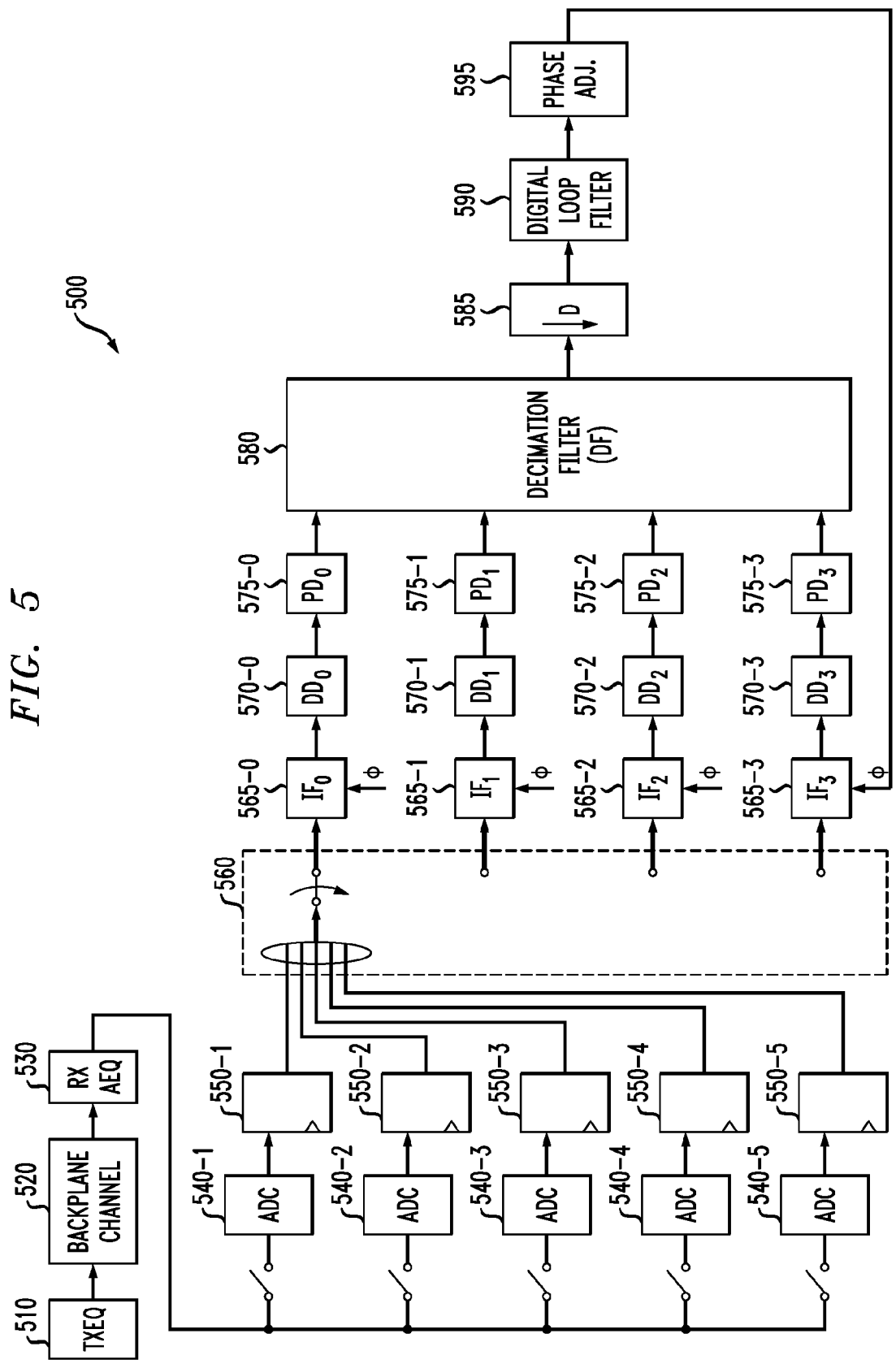
FIG. 5 is a block diagram of an exemplary decimated ICDR according to an alternate embodiment of the present invention.

FIG. 5 is a block diagram of an exemplary decimated ICDR 500 according to an alternate embodiment of the present invention, where the front end is parallel sampled as well for an exemplary decimation factor of four. The transmitter equalization 510, channel 520, and receiver analog equalization 530 operate in a similar manner to FIGS. 1 and 3.

As shown in FIG. 5, for an exemplary decimation factor of four there are five lower rate ADCs 540-1 through 540-5 and four detection paths (comprised of the interpolation filters 565, data detectors 570 and phase detectors 575, which operate in a similar manner to FIG. 3). The commutator switch 560 operates in a similar manner to FIG. 3. Each phase detector 575-0 through 575-3 generates a timing error value at the downsampled rate. These downsampled PD outputs are combined through a decimation filter 580 to produce an output at full rate, and then downsampled at stage 585 to keep one of the four values at the downsampled rate. The overall decimated PD output is then input to the digital CDR loop filter 590. The output of the loop filter 590 controls a phase adjustment processing block 595 that converts the output of the loop filter 590 into a final selected interpolation phase that is continually updated and applied to each interpolation filter 565, as shown in FIG. 5.

The asynchronous clocks to the various ADCs are offset in phase by 1T from one ADC to the next. The number of ADCs, however, depends on the number of taps used in the interpolation filters 565. In the example shown in FIG. 5, five ADCs 540-1 through 540-5 are shown for 5 tap interpolation filters 565. The interpolation filters 565 can be implemented as shown in FIG. 4.

Oversampled Phase Detectors for Decimated ICDR

Heretofore, it has been assumed nominally that each interpolation filter 365, 565 drives each data detector 370, 570 to produce the necessary signal required for the corresponding phase detector 375, 575. This may be typically the case for baud rate phase detectors that use the output of the data detector 370, 570 or one or more signals directly derived from it.

For oversampled phase detectors, however, such as a bang-bang phase detector or a pseudo-linear phase detector (PLPD), the phase detector requires the input samples to be phase shifted by a fractional amount. Therefore, each of the paths shown in FIGS. 3 and 5 require additional interpolation filters 365, 565 to digitally produce these phase shifted signals. The BBPD, for example, requires the signal phase shifted by T/2 and a four output level PLPD requires two more signals at two additional phases that were early and late relative to the T/2 phase shifted signal, as would be apparent to a person of ordinary skill in the art.

Figure 6:
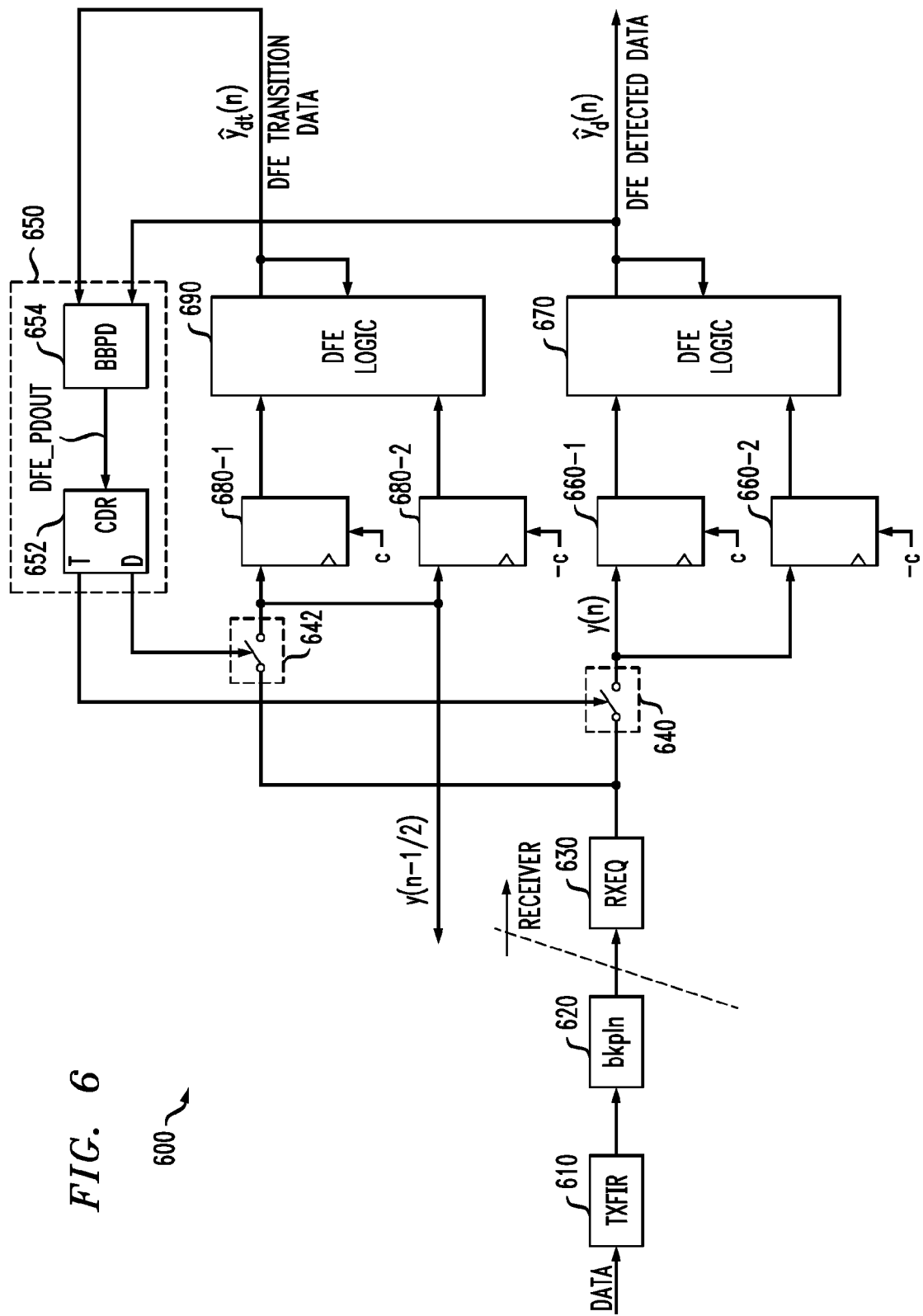
FIG. 6 is a block diagram of a serializer/deserializer communication channel having an oversampled DFE equalized phase detector for a one tap DFE.

FIG. 6 is a block diagram of a serializer/deserializer communication channel 600 having an oversampled DFE equalized phase detector for a one tap DFE that can be employed for decimated ICDR. For a further discussion of the oversampled DFE equalized phase detector 600, see U.S. patent application Ser. No. 11/356,691, filed Feb. 17, 2006, entitled "Method and Apparatus for Generating One or More Clock Signals for a Decision-Feedback Equalizer Using DFE Detected Data," incorporated by reference herein. The oversampled DFE equalized phase detector 600 makes use of a BBPD 654 for a DFE equalized signal. The same structure can be employed and the DFE thresholding operation can be performed in the digital domain. In particular, the oversampled DFE equalized phase detector (collectively, 640, 642, 650, 660, 670, 690) of FIG. 6 can be applied to the digital ICDR of the present invention by performing a digital threshold at the input to the data detector 370, 570 based on the appropriate DFE coefficient for a one tap DFE. The history information (shown by feedback to the DFE logic block) can be used, such that the full rate delayed sample is kept instead of the decimated lower rate history.

As shown in FIG. 6, the data is transmitted through a backplane channel 620 after optionally being equalized or filtered through a transmit FIR filter (TXFIR) 610. After passing though the backplane 620, the analog signal may optionally be filtered or equalized by a receive equalizer (RXEQ) 630. The analog output of the RXEQ 630 is sampled at the baud rate by switch 640, 642. The switch 640 uses a data clock generated by the clock/data recovery circuit 652 and switch 642 uses a transition clock generated by the clock/data recovery circuit 652.

Exemplary latches 660-1 and 660-2 having thresholds of c and −c, respectively, are used to generate a decision for the DFE equalized signal. The decisions from the DFE slicer latches 660 are combined by the DFE logic 670 with the previous DFE detected bit decision, $\hat{y}_d(n-1)$ (represented in FIG. 6 by the arrow fed back into the DFE logic block 670) to produce the final DFE corrected decision $\hat{y}_d(n)$. The DFE path computation logic can be pipelined thereby eliminating the bottleneck of having to complete the computation in one baud period. The DFE logic 670 selects from the pre-computed decisions, which are the outputs of the latches 660 with thresholds c and c, based on the past decision $\hat{y}_d(n-1)$.

For the case when $\hat{y}_d(n-1) = 1$, $$\hat{y}_d(n) = 1 \text{ if } y(n) > c$$
$$= 0 \text{ if } y(n) < c$$

For the case when $\hat{y}_d(n-1) = 0$, $$\hat{y}_d(n) = 1 \text{ if } y(n) > -c$$
$$= 0 \text{ if } y(n) < -c$$

The outputs of the latches 660 are applied to DFE logic 670 to generate the DFE corrected decision $\hat{y}_d(n)$.

In addition, the channel 600 includes a switch 642, latches 680-1 and 680-2, and DFE logic 690, for the creation of the DFE transition data. The DFE transition data is created as follows:

For the case when $\hat{y}_{dt}(n-1) = 1$, $\hat{y}_{dt}(n) = 1$ if $y(n-1/2) > c$
$= 0$ if $y(n-1/2) < c$ For the case when $\hat{y}_{dt}(n-1) = 0$, $\hat{y}_{dt}(n) = 1$ if $y(n-1/2) > -c$
$= 0$ if $y(n-1/2) < -c$ where $y(n-½)$ represents the amplitude of the non-DFE transition sampled data.

Sample Rate Control With Frequency Offset

As previously indicated, M. Spurbeck and R. Behrens, and Z. Wu and J. Cioff do not discuss specific solutions on how to control the sample rate with a frequency offset.

Figure 7:
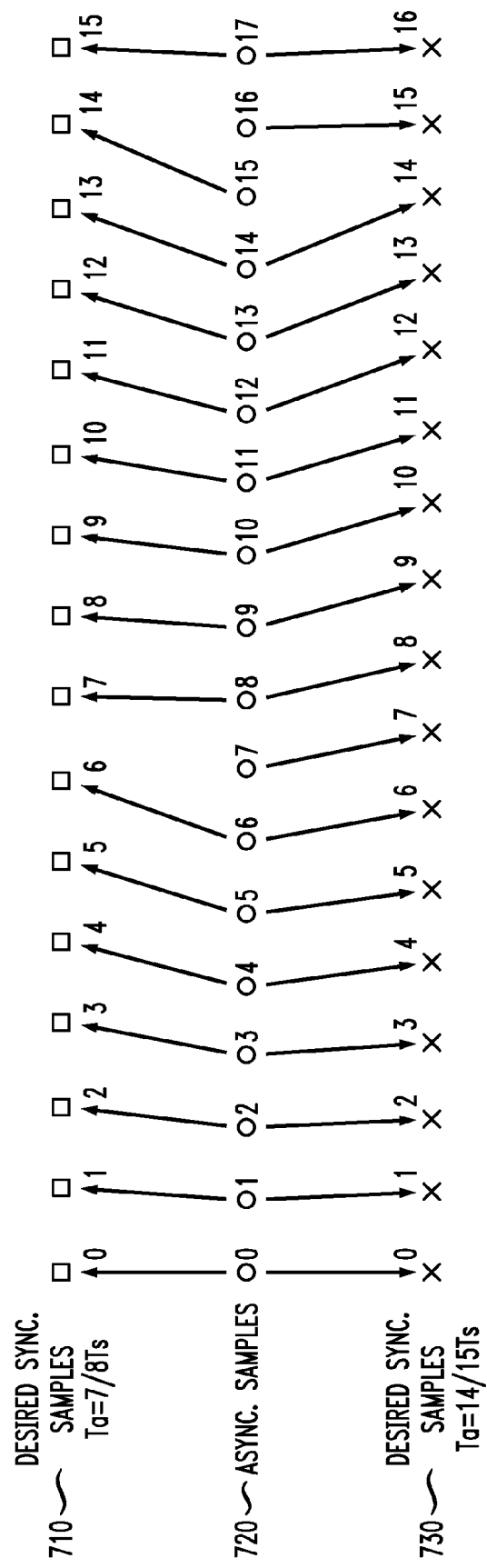
FIG. 7 illustrates an example of interpolated sampling.

FIG. 7 illustrates an example of interpolated sampling. The frequency offset numbers used in FIG. 7 are for illustrative purposes only. FIG. 7 illustrates three sets of samples 710, 720, 730. The second row of samples 720, shown in FIG. 7 with circles, are asynchronous samples with the time between them being the asynchronous sample period Ta. The top row of samples 710, shown in FIG. 7 as squares, are desired synchronous samples such that Ta is equal to ⅞ Ts, where Ts is the synchronous sample period spacing. This exemplary ratio of ⅞ corresponds to a frequency offset of 125,000 ppm and an oversampling factor of 12.5%. The synchronous samples 710 and asynchronous samples 720 are phase aligned, i.e., sample number 0 for both sets occur at the same time.

The asynchronous samples 720 can be digitally interpolated to the synchronous samples 710. For example, asynchronous sample 1 can be interpolated to synchronous sample 1. Of course, the sample history of the asynchronous samples 720 are used to perform the interpolation filtering, not just one sample (likewise, for successive samples). However, note that asynchronous sample 8 is not needed and does not correspond to any interpolated synchronous sample, i.e., for every 9 asynchronous samples, only 8 synchronous samples are produced. In other words, after every 8 asynchronous samples an interpolated sample is not produced corresponding to the next asynchronous sample. This is consistent with the ⅞ ratio between Ta and Ts. Continuing, this pattern repeats such that sample 16 does not need to be interpolated to any synchronous sample. Also, note that although asynchronous samples 8 and 16 do not need to be interpolated into synchronous samples, they are used as part of the sample history into the interpolation filters in the interpolation of adjacent asynchronous samples.

Another example is shown in the third row of FIG. 7, where synchronous samples 730 (illustrated using crosses or "X"s) with Ta equal to ¹⁴/₁₅ Ts corresponding to 66,667 ppm or 6.67% oversampling. In this case, every 16 asynchronous samples 720 produces 15 synchronous samples 730. In other words, after every 16 asynchronous samples 720, an interpolated sample corresponding to the next asynchronous sample is not produced.

Figure 8:
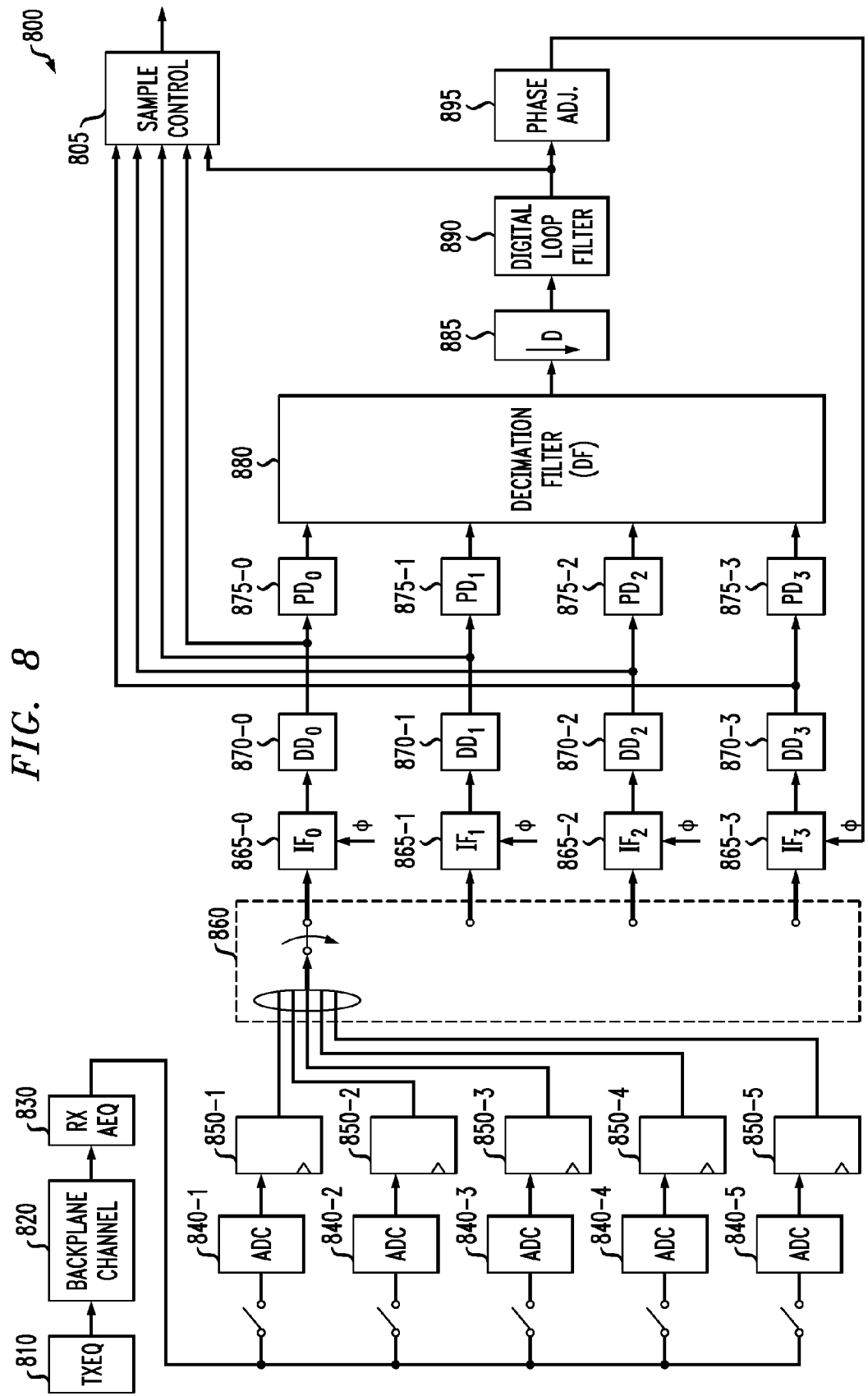
FIG. 8 is a block diagram of an exemplary decimated ICDR according to an alternate embodiment of the present invention.

FIG. 8 is a block diagram of an exemplary decimated ICDR 800 according to an alternate embodiment of the present invention using a sample control block 805, where the front end is parallel sampled in a similar manner to FIG. 5. In practice, the actual ratio of Ta to Ts is not known a priori to determine the above type of sample rate control. The sample rate can be controlled based on the state of the loop filter (590 in FIG. 5). For a second order proportional integral loop filter 590, the integral loop output measures the frequency offset Ta/Ts. Therefore, the decimated ICDR 800 uses this frequency offset Ta/Ts to control (in a time varying fashion) the sample processing relationship between the asynchronous samples 720 and interpolated synchronous samples 710, 730.

The transmitter equalization 810, channel 820, and receiver analog equalization 830 operate in a similar manner to those described above. As shown in FIG. 8, for an exemplary decimation factor of four there are five lower rate ADCs 840-1 through 840-5 and four detection paths (comprised of the interpolation filters 865, data detectors 870 and phase detectors 875, which operate in a similar manner to FIG. 5). The commutator switch 860 operates in a similar manner to FIG. 5. Each phase detector 875-0 through 875-3 generates a timing error value at the downsampled rate. These downsampled PD outputs are combined through a decimation filter 880 to produce an output at full rate, and then downsampled at stage 885 to keep one of the four values at the downsampled rate. The overall decimated PD output is then input to the digital CDR loop filter 890. The output of the loop filter 890 controls a phase adjustment processing block 895 that converts the output of the loop filter 890 into a final selected interpolation phase that is continually updated and applied to each interpolation filter 865, as shown in FIG. 8.

Recovered Clock Generation

The decimated interpolated CDR system discussed thus far produces recovered data synchronous to the received signal as shown in FIG. 8. Unlike a non-interpolated system, a recovered clock is not produced as a natural outcome of the CDR operation. The sample control 805 produces the synchronous samples that are synchronous to the signal in an average sense with respect to the asynchronous clock. If the recovered data that is synchronous to the received signal must be retransmitted to a different system, it must be accompanied by a recovered clock whose edges correspond to the spacing of the synchronous recovered data. This can be done using a numerically controlled oscillator, in a known manner.

Figure 9:
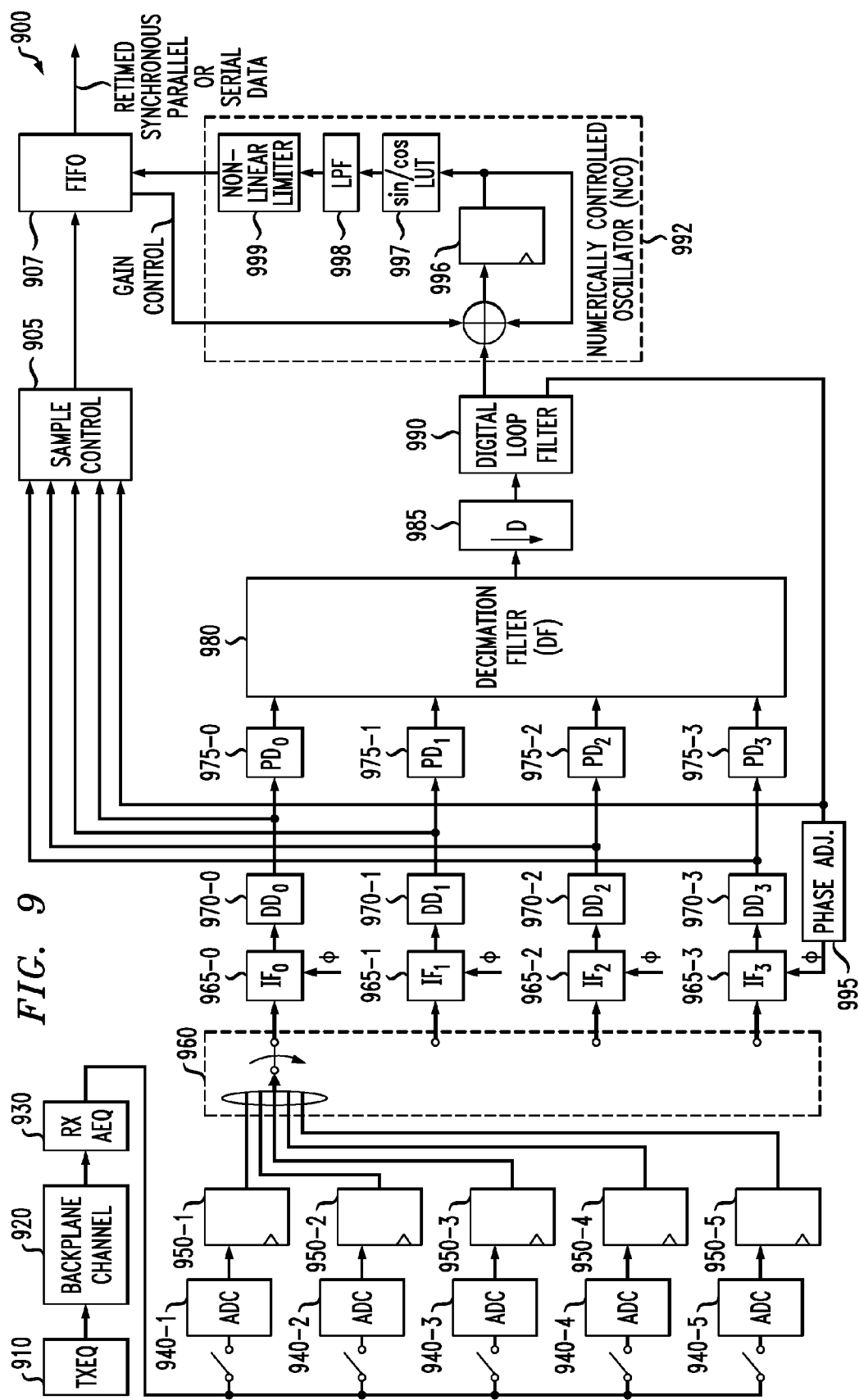
FIG. 9 is a block diagram of an exemplary decimated ICDR according to a further alternate embodiment of the present invention.

FIG. 9 is a block diagram of an exemplary decimated ICDR 900 according to a further alternate embodiment of the present invention using a sample control block 905 and clock generation through a numerically controlled oscillator 992. The front end is parallel sampled in a similar manner to FIG. 5. The transmitter equalization 910, channel 920, and receiver analog equalization 930 operate in a similar manner to those described above. In addition, the lower rate ADCs 940-1 through 940-5, interpolation filters 965, data detectors 970, phase detectors 975 and commutator switch 960 operate in a similar manner to FIG. 5. Each phase detector 975-0 through 975-3 generates a timing error value at the downsampled rate. These downsampled PD outputs are processed by a decimation filter 980, downsample stage 985, loop filter 990 and phase adjustment processing block 995 in the same manner as described above.

The CDR digital loop filter 990 can provide information needed to produce an error signal that is accumulated in a numerically controlled oscillator (NCO) 992. The output of an accumulator 996 controls a look up table (LUT) 997 that synthesizes a digital sinusoidal waveform that can be low pass filtered with an analog low pass filter (LPF) 998 to produce a sinusoidal clock waveform. The sinusoidal clock can be shaped with a non-linear limiter 999 (e.g., a comparator) to produce a near rectangular clock signal which is synchronous to the retimed data. The samples from the sample control block 905 are sent through a FIFO 907 that is clocked with the output clock from the NCO 992. It is noted that the analog circuitry of FIG. 9 consisting of the LPF 998 and non-linear limiter 999 is easier to design than, for example, a VCDL needed in a non-ITR based CDR architecture.

As shown in FIG. 9, a gain control signal generated by the FIFO 907 is applied to the summer at the input of the accumulator 996. When the data of the FIFO 997 exceeds a predefined high marker, the clock needs to be slowed down and vise versa. The gain control signal coming from FIFO 907 (for example, a value of 1 can indicate to decrease the clock and a value of 0 can indicate to increase the clock frequency of the NCO 992) will increase or decrease the NCO clock frequency such that average data out and average clock samples are maintained constant.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. A method for asynchronous sampling of a received signal, comprising:
   converting said received signal to a plurality of digital samples at a downsampled rate that is lower than a rate of said received signal;
   interpolating said plurality of digital samples using a plurality of parallel interpolation filters operating at said downsampled rate;
   applying an output of each of said parallel interpolation filters to a corresponding parallel data detector operating at said downsampled rate to generate digital data;
   generating an estimate of a timing error based on said digital data; and
   processing said timing error estimates to generate an interpolation phase value that is applied to said parallel interpolation filters.

2. The method of claim 1, wherein said digital samples at a downsampled rate are generated by delaying a full rate output of an analog to digital converter.

3. The method of claim 1, wherein said digital samples at a downsampled rate are generated by a plurality of parallel analog to digital converters.

4. The method of claim 1, wherein said generating step further comprises the steps of generating an estimate of the timing error for each of said parallel data detectors at said downsampled rate, and combining said plurality of downsampled timing error estimates to generate full rate timing error estimates.

5. The method of claim 4, further comprising the step of downsampling said full late timing error estimtes to generate an overall decimated phase detector output.

6. The method of claim 5, further comprising the step of applying said overall decimated phase detector output to a digital loop filter that generates said interpolation phase value.

7. The method of claim 1, wherein said generating step is performed by one or more oversampled phase detectors arid said method further comprises the step of further interpolating said plurality of digital samples to phase shift said digital samples by a fractional amount.

8. The method of claim 1, further comprising the step of digitally interpolating asynchronous samples to a desired synchronous sampling period.

9. The method of claim 8, further comprising the step of generating a recovered clock having edges corresponding to said desired synchronous sampling period.

10. A system for asynchronous sampling of a received signal, comprising:
    at least one analog to digital converter configured to convert said received signal to a plurality of digital samples at a downsampled rate that is lower than a rate of said received signal;
    a plurality of parallel interpolation filters operating at said downsampled rate configured to interpolate said plurality of digital samples;
    a plurality of parallel data detectors to generate digital data, each of said parallel data detectors processing an output of a corresponding one of said parallel interpolation filters, and each of said parallel data detectors operating at said downsampled rate;
    at least one phase detector configured to generate an estimate of a timing error based on said digital data; and
    a digital loop filter configured to process said timing error estimates to generate an interpolation phase value that is applied to said parallel interpolation filters.

11. The system of claim 10, wherein said digital samples at a downsampled late are generated by delaying a frill rate output of an analog to digital converter.

12. The system of claim 10, wherein said digital samples at a downsampled rate are generated by a plurality of parallel analog to digital converters.

13. The system of claim 10, further comprising a plurality of said phase detectors to generate an estimate of the timing error for each of said parallel data detectors at said downsampled rate, and means for combining said plurality of downsampled timing error estimates to generate frill rate timing error estimates.

14. The system of claim 13, further comprising a downsampling filter to downsample said full rate timing error estimates to generate an overall decimated phase detector output.

15. The system of claim 14, wherein said overall decimated phase detector output is applied to said digital loop filter to generate said interpolation phase value.

16. The system of claim 10, wherein said at least one phase detector comprises one or more oversampled phase detectors and said system further comprises one or more additional interpolation filters to further interpolate said plurality of digital samples to phase shift said digital samples by a factional amount.

17. The system of claim 10, further comprising a sample control block to digitally interpolate asynchronous samples to a desired synchronous sampling period.

18. The system of claim 17, further comprising a buffer for generating a recovered clock having edges corresponding to said desired synchronous sampling period.

19. A system for asynchronous sampling of a received signal, comprising:
  means for converting said received signal to a plurality of digital samples at a downsampled rate that is lower than a rate of said received signal;
  means for interpolating said plurality of digital samples using a plurality of parallel interpolation filters operating at said downsampled rate;
  means for applying an output of each of said parallel interpolation filters to a corresponding data detector operating at said downsampled rate to generate digital data;
  means for generating an estimate of a timing error based on said digital data; and
  means for processing said timing error estimates to generate an interpolation phase value that is applied to said parallel interpolation filters.

20. The system of claim 19, further comprising means for generating a recovered clock having edges corresponding to a desired synchronous sampling period.

* * * * *

UNITED STATES PATENT AND TRADEMARK OFFICE
CERTIFICATE OF CORRECTION

PATENT NO.       : 7,411,531 B2                                       Page 1 of 1
APPLICATION NO.  : 11/480327
DATED            : August 12, 2008
INVENTOR(S)      : Pervez M. Aziz It is certified that error appears in the above-identified patent and that said Letters Patent is hereby corrected as shown below:

In claim 11, column 10, line 43, "late" should be replaced by -- rate --.

In claim 11, column 10, line 43, "frill" should be replaced by -- full --.

In claim 13, column 10, line 53, "frill" should be replaced by -- full --.

Signed and Sealed this
Eighteenth Day of December, 2012

David J. Kappos
*Director of the United States Patent and Trademark Office*